United States Patent [19]

Widmer et al.

[11] Patent Number: 4,504,521

[45] Date of Patent: Mar. 12, 1985

[54] LPCVD DEPOSITION OF TANTALUM SILICIDE

[75] Inventors: Alois E. Widmer, Berikon; Roland Fehlmann, Au, both of Switzerland

[73] Assignee: RCA Corporation, New York, N.Y.

[21] Appl. No.: 592,397

[22] Filed: Mar. 22, 1984

[51] Int. Cl.$^3$ .......................................... H01L 21/285
[52] U.S. Cl. ........................................ 427/85; 427/93; 427/95; 427/255.2; 427/255.7
[58] Field of Search ................ 427/85, 93, 95, 255.2, 427/255.7

[56] References Cited

U.S. PATENT DOCUMENTS

| | | | |
|---|---|---|---|
| 4,332,839 | 6/1982 | Levinstein et al. | 427/85 |
| 4,357,179 | 11/1982 | Adams | 427/85 |
| 4,359,490 | 11/1982 | Lehrer | 427/95 |
| 4,362,597 | 12/1982 | Fraser et al. | 156/643 |
| 4,411,734 | 10/1983 | Maa | 156/643 |

OTHER PUBLICATIONS

Harbeke et al., RCA Review, vol. 44, pp. 287–312, Jun. 1983.
Lehrer et al., Proc. First International Sympos. (VLSI) Science and Technology, pp. 258–264 Oct., 1982.
Murarka, Silicides for VLSI applications—Academic Press, 1983, pp. 115–131, and 180–183.
Harbeke et al., RCA Review vol. 44, pp. 287–312, Jun. 1983.

*Primary Examiner*—John D. Smith
*Attorney, Agent, or Firm*—Birgit E. Morris; R. Hain Swope

[57] ABSTRACT

An improved method of forming a polycide structure is disclosed. An in-situ doped silicon layer is deposited in the amorphous state by LPCVD at 560°–580° C., a polycrystalline tantalum rich tantalum silicide layer is deposited thereover by LPCVD and the structure annealed to convert the silicon to the polycrystalline state and the tantalum silicide to $TaSi_2$. The deposition and annealing procedures are carried out sequentially in a single reaction vessel.

9 Claims, No Drawings

LPCVD DEPOSITION OF TANTALUM SILICIDE

This invention relates to a method of depositing a polycrystalline silicon/tantalum silicide structure on a suitable surface for use in the production of electronic devices.

BACKGROUND OF THE INVENTION

The replacement of doped polycrystalline silicon structures with a two-layer structure comprising a layer of a refractory metal silicide overlying a layer of doped polycrystalline silicon to obtain improved lateral conductivity is becoming increasingly common in the electronics industry. Such structures are commonly termed "polycide" structures. The sheet resistance of polycide structures is generally an order of magnitude lower than that of a single layer structure of doped polycrystalline silicone alone.

Polycide structures are utilized to achieve a high-conductivity, gate-level metallization for metal-oxide-semiconductor (MOS) devices. More particularly, polycide structures are utilized as gate material and interconnects in structures, such as very high speed integrated circuits (VHSIC). Polycide structures have been used, for example, as the gate material in insulated gate field effect transistor (IGFET) devices and other similar structures.

Polycide structures are conventionally produced by depositing undoped polycrystalline silicon by low pressure chemical vapor deposition (LPCVD), doping the polycrystalline silicon, e.g. by diffusion using phosphorus oxychloride, and then depositing the refractory metal silicide, e.g. tantalum silicide, thereover by co-sputtering from separate targets of metal and silicon. Subsequent annealing is required to obtain the desired low conductivity of the silicide layer. This method, while effective, has the disadvantage that it must be carried out sequentially in different types of apparatus which involves multistep handling of the substrate.

Lehrer, in U.S. Pat. No. 4,359,490, discloses a process of forming polycide structures entirely by LPCVD. The ratio of tantalum to silicon in the as-deposited film is not given, except that it is referred to as "tantalum silicide". Lehrer et al., in a later paper presented at the First International Symposium on VLSI Science and Technology, October 1982, describe depositing tantalum silicide directly from tantalum pentachloride and silane at temperatures of 600° to 650° C. The film is stated to be metal rich, i.e. close to $Ta_5Si_3$. It is noted, however, that the upper surface of the silicide layer and the interface between the silicide and the polycrystalline silicon layers became quite rough in converting the metal rich silicide to stoichiometric $TaSi_2$ due to the nonuniform adsorption of silicon from the silicon layer. It was therefore concluded by Lehrer et al. that it would be desirable to deposit tantalum silicide directly in the form of stoichiometric $TaSi_2$.

In accordance with this invention, a method of forming polycrystalline silicon/tantalum silicide structures has been found in which all steps are carried out in a single reaction chamber and which does not suffer the disadvantages described above.

SUMMARY OF THE INVENTION

A polycide structure is formed by sequentially depositing amorphous, doped silicon and metal rich tantalum silicide, i.e. predominately $Ta_5Si_3$, by LPCVD followed by annealing at higher temperatures to convert the silicon to the polycrystalline state and the $Ta_5Si_3$ to the desired $TaSi_2$. The silicon required for this transformation is supplied by the silicon layer. All procedures in the subject method are carried out in the same reaction chamber.

DETAILED DESCRIPTION OF THE INVENTION

The substrate receiving the two-layer polycide structure in accordance with this invention may be of any material conventionally used in the electronics industry. A preferred substrate is a single crystal silicon wafer. The substrate may be partially processed, e.g. doped, to provide regions of conductivity. Conventionally, there is a layer of gate oxide, i.e. silicon dioxide, immediately underlying the subject structures. In the instance of a single crystal silicon wafer, the layer of gate oxide is provided by conventional thermal oxidation.

A layer of doped silicon is deposited over the gate oxide, or other substrate surface, by low pressure chemical vapor deposition (LPCVD) in a conventional apparatus. The silicon is grown in the amorphous state at a temperature between about 560° to 580° C. Subsequent annealing converts it to the polycrystalline state Silicon films grown in the amorphous state and subsequently annealed to convert them to the polycrystalline state are clearly superior in properties, particularly surface smoothness, to films grown in the polycrystalline state at temperatures in excess of 600° C. as disclosed in Widmer et al., copending U.S. Pat. application, Ser. No. 441,371, filed Nov. 12, 1982, the disclosure of which is incorporated herein by reference. In addition to their exceptional smoothness, amorphous-deposited silicon films are superior to films deposited in the polycrystalline state with regard to their microhomogeneity and lack of strain. This surprisingly holds true for silicon films doped in-situ as is the case with the structure of this invention.

The silicon layer is doped as deposited by mixing a suitable doping with the silicon-containing vapor, e.g. silane. The silicon layer is preferably doped with phosphorus utilizing phosphine as the dopant. As disclosed in the Widmer et al. application, there is no appreciable increase in the surface roughness of these films in comparison with amorphous-deposited undoped films. This is unexpected since it is recognized that in-situ phosphorus doping enhances grain growth in silicon films.

The silicon layer is deposited in a conventional LPCVD apparatus, preferably at about 575° C., at a pressure of between about 350 and 500 mtorr. The gas flow of the source of silicon, e.g. silane, is suitably between about 250 and 300 $cm^3$/min. Phosphine is added as a one percent mixture diluted with nitrogen, preferably in a $8 \times 10^{-4}$ ratio with silane. The film of doped amorphous silicon deposited in this manner is suitably between about 300 and 400 nanometers, preferably about 350 nanometers, in thickness. Prior to introducing silane and phosphine into the reaction chamber, it is purged first with an inert gas, e.g. nitrogen, and then with a reducing gas, e.g. hydrogen. The purge with the reducing gas removes any unreacted tantalum pentachloride that may have remained from a previous run.

When the desired thickness of doped amorphous silicon has been deposited on the substrate, the phosphine gas is simply replaced in the reaction mixture with tantalum pentachloride, the temperature of the deposition apparatus remaining constant. Tantalum pentachloride, a solid, is vaporized by heating to a temperature of between about 140° and 160° C. The tantalum pentachloride is preferably introduced into the deposition tube by its own vapor pressure. If desired, a heated carrier gas, e.g. nitrogen, may be flowed across the surface of the solid tantalum pentachloride to enhance transport. The tantalum pentachloride supply line and shut-off valve are heated to a slightly higher temperature to prevent condensation of the vapor during passage into the deposition apparatus. Nitrogen is also introduced into the deposition tube as a diluent gas to improve the uniformity of distribution of the tantalum silicide film.

In the deposition of tantalum silicide in accordance with the subject process, the pressure of the system before the addition of tantalum pentachloride is typically adjusted to about 200 mtorr. The pressure increases to about 300 mtorr when the tantalum pentachloride is introduced into the system. The layer of tantalum silicide is deposited metal rich, i.e. as a mixture of $Ta_5Si_3$ with a minor amount of $TaSi_2$. In contrast to the conclusions drawn by Lehrer et al. in the aforementioned paper, i.e. that a method should be sought to deposit tantalum silicide as stoichiometric $TaSi_2$, we have found that it is possible to deposit a film of metal rich tantalum silicide which has a smooth surface, a remarkably uniform interface with the underlying silicon layer and excellent uniformity over the length of the deposition zone.

The tantalum silicide film is suitably deposited to a thickness of from about 175 to 250 nanometers, preferably about 200 nanometers. The thickness of either layer and the structure as an entity may vary depending on the intended use thereof, the topography of the substrate and the like. The tantalum silicide layer deposited in the temperature range of 560° to 580° C. is in the polycrystalline state.

After deposition of the two-layer structure is completed, the reaction vessel is purged, first with hydrogen to remove any unreacted tantalum pentachloride present, and subsequently with nitrogen. Other art-recognized reducing and inert gases may be utilized for the purging procedures if desired, e.g. argon may be used in place of nitrogen. The temperature is then raised to from about 800° to 950° C., preferably about 850° C., and held for a time sufficient to: convert the silicon layer from the amorphous to the polycrystalline state; cause the migration of silicon into the silicide layer to convert the $Ta_5Si_3$ to $TaSi_2$; and anneal the silicide layer to obtain the desired high electrical conductivity. Generally, from 15 to 60, preferably 30, minutes is required at the annealing temperature to accomplish these objectives. There is preferably a slight nitrogen flow into the reaction chamber during the annealing procedure. When annealing is completed, dry nitrogen is admitted into the chamber until the pressure returns to ambient and the substrate is withdrawn. The polycide structure is conventionally patterned with a photoresist suitable for dry etching techniques. A preferred material is a positive photoresist available from Hunt Chemical Co. under the trademark HPR 204. The structure is then etched, preferably with an etchant mixture of carbon tetrachloride, oxygen and nitrogen as disclosed in Maa, U.S. Pat. No. 4,411,734, issued Oct. 25, 1983. An anisotropic etch is achieved in this manner. The patterned structure is then preferably protected with a thin layer of silicon oxide grown by either steam or dry oxidation.

The subject polycide structures have been shown to be at least as good as prior co-sputtered films with regard to conductivity and etchability. The advantages of the present process are evident. Polycide structures are formed in accordance with this invention in a single piece of apparatus by a simple process which does not require manipulating the substrates or exposing them to the atmosphere. There are no separate diffusion and annealing procedures required with the resultant savings in time, expense and energy. The interface between the two layers of the subject polycide structures is substantially more uniform than the structures described and illustrated in the above-mentioned Lehrer et al. paper. In addition, although the subject structures are not at present as smooth as similar structures formed by conventional cosputtering processes, they have a substantially smoother surface than those described and illustrated by Lehrer et al. This latter property makes the subject structures ideal for further processing, particularly for multilayer structures where layers of other materials may be wholly or partially deposited thereover.

The following example further illustrates this invention, it being understood that the invention is in no way intended to be limited to the details described therein. In the Example, all parts and percentages are on a weight basis and all temperatures are in degrees Celsius, unless otherwise stated.

EXAMPLE

Thirty (100) single crystal silicon wafers, three inches in diameter, where utilized as substrates. The wafers were heated to 900° in steam for 50 minutes to form a layer of silicon dioxide about 200 nanometers thick on the surface.

The wafers were placed in a LPCVD reactor in a quartz tube which was heated to 575°. The reactor was evacuated to 150 mtorr and dry nitrogen was allowed to flow through the reactor for 10 minutes after which hydrogen was flowed through the reactor for 8 minutes.

Deposition of doped amorphous silicon was carried out at 350 mtorr pressure and a flow of 300 $cm^3$/min. of silane and 24 $cm^3$/min. of 1 percent phosphine by volume in nitrogen. The ratio of phosphine to silane in the deposition gas was $8 \times 10^{-4}$. Deposition was continued for 145 minutes during which a layer of amorphous silicon 350 nanometers thick was deposited. The silicon layer contained about 0.4 percent of phosphorus. The electrical conductivity of the silicon layer, after annealing of the completed polycide structure, was determined to be about $6 \times 10^2 [ohm-cm]^{-1}$. The growth rate of the doped amorphous silicon was about 2.5 nanometers per minute.

At the completion of the silicon deposition, the flow of the phosphine/nitrogen mixture was stopped and the flow of silane adjusted to 40 $cm^3$/min. A flow of 20 $cm^3$/min. of nitrogen was introduced into the reaction tube. Tantalum pentachloride from a source heated to 152° was flowed into the reaction chamber at a calculated rate of 15 $cm^3$/min, based on the weight change in the source. The tantalum pentachloride vapor was flowed into the reaction chamber through heated gas lines to prevent condensation of the vapor. Deposition of tantalum silicide was carried out for 22 minutes during which a layer 200 nanometers thick was deposited. The growth rate was approximately 9 nanometers per minute.

After completion of the deposition of tantalum silicide, the flow of both silane and tantalum pentachloride was shut off and dry hydrogen was flowed through the reactor for 4 minutes. The reactor was thereafter purged with dry nitrogen for four minutes and the temperature raised to 850° over a period of about 15 minutes. The substrates were maintained under an atmosphere of dry nitrogen at 850°, 200 mtorr, for 30 minutes after which the reactor was allowed to return to ambient pressure under dry nitrogen. The wafers were then withdrawn.

The layer of tantalum silicide had a smooth surface and was found by x-ray diffraction to be $TaSi_2$. Conventional resistivity and etchability experiments conducted on the structure showed it to be at least comparable to similar structures prepared by co-sputtering a layer of tantalum silicide onto a layer of amorphous deposited silicon.

We claim:

1. A method of forming on a substrate a structure comprising a layer of polycrystalline silicon having thereover a layer of tantalum silicide, said method being carried out in a single reaction vessel and comprising:
   (a) depositing a layer of in-situ doped silicon on the substrate by low pressure chemical vapor deposition in a suitable reactor, said layer being deposited in the amorphous state from a vapor containing silicon and a suitable dopant;
   (b) depositing a layer of tantalum silicide over the layer of silicon by stopping the flow of said dopant into the reactor and introducing tantalum pentachloride vapor while containing the flow of the source of silicon, said layer of tantalum silicide being deposited tantalum 2. A method in accordance with claim 1, wherein the silicon layer is deposited at a temperature from about 560° C. to 580° C.

3. A method in accordance with claim 2, wherein the silicon layer is deposited at about 575° C.

4. A method in accordance with claim 1, wherein the vapor containing silicon is silane.

5. A method in accordance with claim 1, wherein the silicon layer is doped with phosphorus and the dopant is phosphine.

6. A method in accordance with claim 1, wherein the structure is annealed at a temperature of about 800° C. to 950° C. in an inert atmosphere at reduced pressure.

7. A method in accordance with claim 6, wherein the structure is annealed at about 850° C.

8. A method in accordance with claim 6, wherein the inert atmosphere is nitrogen.

9. A method in accordance with claim 1, wherein the reactor is successively purged with nitrogen and hydrogen before deposition of the silicon layer.

* * * * *

UNITED STATES PATENT AND TRADEMARK OFFICE
CERTIFICATE OF CORRECTION

PATENT NO. : 4,504,521

DATED : March 12, 1985

INVENTOR(S): Widmer et al.

It is certified that error appears in the above-identified patent and that said Letters Patent is hereby corrected as shown below:

Column 6, line 8, insert -- rich; and -- after "tantalum".

Column 6, line 9, insert --(c) raising the temperature to anneal said structure thereby converting the doped silicon layer to the polycrystalline state and the tantalum silicide layer to $TaSi_2$.--

Signed and Sealed this

Seventeenth Day of September 1985

[SEAL]

Attest:

Attesting Officer

DONALD J. QUIGG

Commissioner of Patents and Trademarks—Designate